United States Patent
Westwood

[11] Patent Number: 5,827,414
[45] Date of Patent: Oct. 27, 1998

[54] SINGLE PIECE SLOTTED FERROMAGNETIC SPUTTERING TARGET AND SPUTTERING APPARATUS

[75] Inventor: John David Westwood, San Jose, Calif.

[73] Assignee: International Business Machines Corporation, Armonk, N.Y.

[21] Appl. No.: 900,771

[22] Filed: Jul. 25, 1997

[51] Int. Cl.[6] .............................. C23C 14/34; C23C 14/35
[52] U.S. Cl. ............................... 204/298.12; 204/298.13; 204/298.19; 204/192.2
[58] Field of Search ...................... 204/298.12, 298.16, 204/298.17, 298.18, 298.19, 298.13, 192.2, 298.14

[56] References Cited

U.S. PATENT DOCUMENTS

| | | | |
|---|---|---|---|
| 4,200,510 | 4/1980 | O'Connell et al. | 204/192 R |
| 4,299,678 | 11/1981 | Meckel | 204/298.12 |
| 4,401,546 | 8/1983 | Nakamura et al. | 204/298.12 |
| 4,412,907 | 11/1983 | Ito et al. | 204/298.12 |
| 4,834,860 | 5/1989 | Demaray et al. | 204/298.12 |
| 5,632,869 | 5/1997 | Hurwitt et al. | 204/298.12 |

FOREIGN PATENT DOCUMENTS

| | | |
|---|---|---|
| 2-11211 | 11/1984 | Japan . |
| 63-35769 | 2/1988 | Japan . |
| 6-287750 | 10/1994 | Japan . |

*Primary Examiner*—M. Nuzzolillo
*Assistant Examiner*—Rodney G. McDonald
*Attorney, Agent, or Firm*—John H. Holcombe

[57] ABSTRACT

Disclosed is a target for a ferromagnetic sputtering apparatus formed of a single piece of ferromagnetic target material. The target has a circular central area, an annular outer area, and a plurality of interconnected slots of specified width in the single piece extending in circumferential directions about the central area, forming a plurality of specified width radial gaps between the circular central area and the annular outer area. The slots of the sputtering target may be arranged to provide tabs crossing the slots to provide structural support to the specified width slots.

20 Claims, 11 Drawing Sheets

Detail B

Detail C

Section D-D
(In the Plane of the Slot)

Section A-A

Detail B

Section C-C
(In the Plane of the Slot)

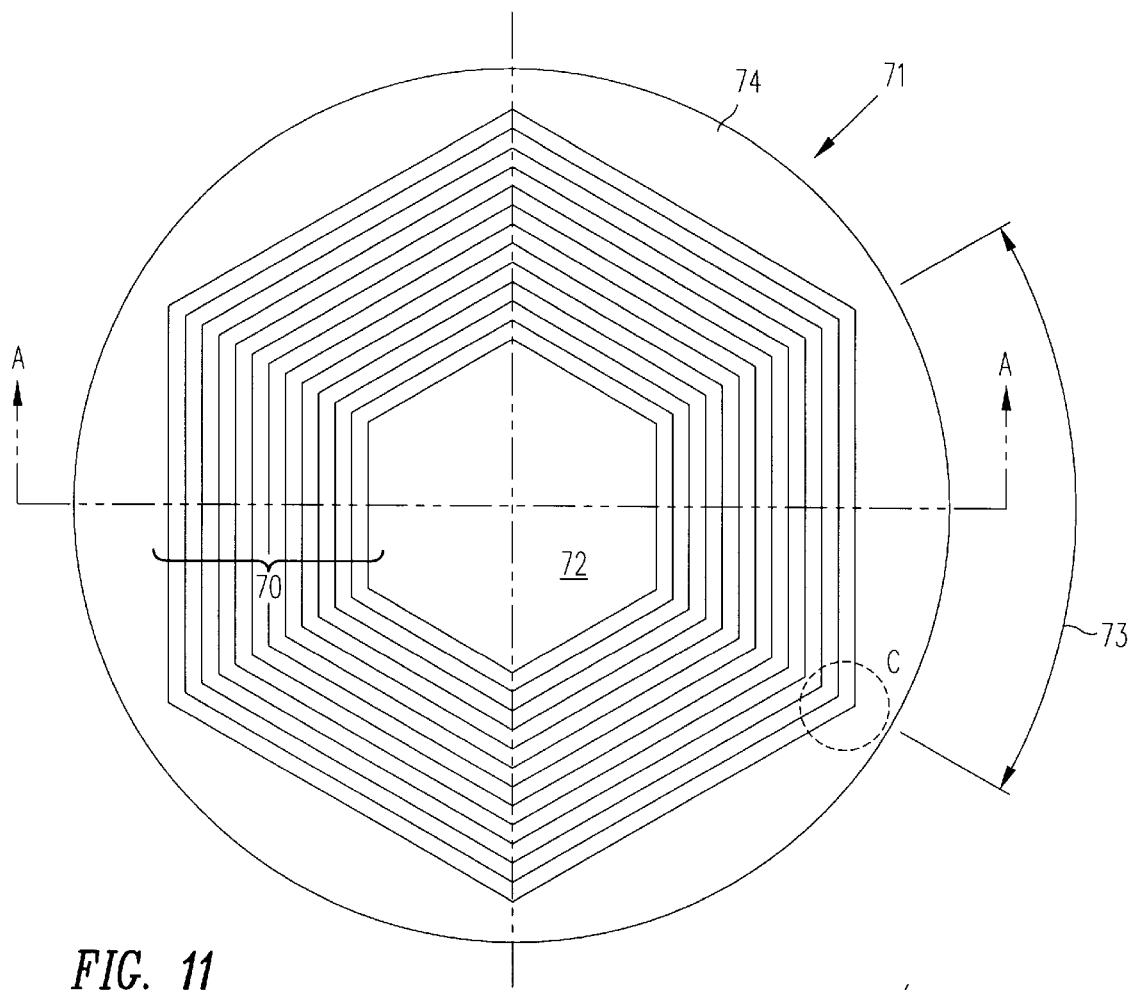
FIG. 11
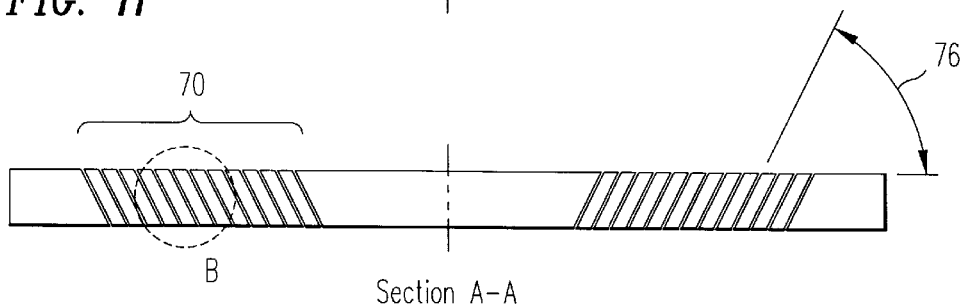
Section A-A
FIG. 12
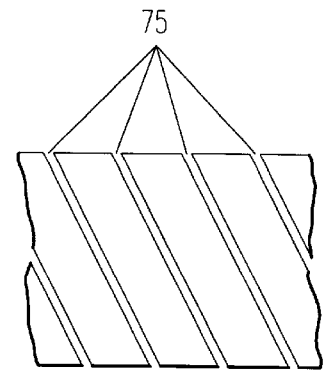
FIG. 13    Detail B Detail C
Bottom Surface Section D-D
(In the Plane of the Cut)

Section B-B
(Perpendicular to the Target Surface)

Section C-C
(In the Plane of the Tab Cuts)

SINGLE PIECE SLOTTED FERROMAGNETIC SPUTTERING TARGET AND SPUTTERING APPARATUS

TECHNICAL FIELD

This invention relates to ferromagnetic sputtering targets and sputtering apparatus, and, more particularly, to targets that provide a more homogeneous magnetic field for sputtering the target.

BACKGROUND OF THE INVENTION

Sputtering of ferromagnetic materials is conducted in an evacuated chamber, with a substrate to receive the sputtered material and a target to supply the material within the evacuated chamber. The chamber may be filled at low pressure with an inert gas, such as argon. Typically, the sputtering apparatus employs a magnetic field generator, or magnetron array, having a central pole of one polarity and an outer pole of the opposite polarity where the outer pole is separated from and surrounds the central pole. A backing plate supporting a target is placed over the magnetic field generator. A water cooling path is provided in the area of the magnetic field generator between the poles and under the backing plate. A cathode potential is applied to the target to sputter the target so that material flux from the target is deposited on the substrate.

The target is typically iron or other ferromagnetic material, often assembled from separate segments to form an annular or rectangular body where the segments are separated by small gaps. The magnetron provides a magnetic field in the target body between the central pole and the outer pole and the gaps in the target body produce a leakage magnetic field on and parallel to the surface of the target body so that the sputtering plasma density may be increased. An example is illustrated in U.S. Pat. No. 4,412,907, Ito et al.

The gaps should be of equal width to prevent the generated magnetic field from finding an "easy path" which would concentrate the magnetic field. A concentrated magnetic field causes excessive erosion or "wear" of the target in the area of the concentrated magnetic field.

It is both difficult and expensive to precisely align each of the separate segments of the target to insure that the gaps are of equal or specified widths.

One approach is to reduce the number of gaps by having a single central segment, a single outer segment, and one intermediate segment, providing only 2 gaps at either side of the intermediate segment. The small number of gaps provides a less effective magnetic field.

Another approach, represented by U.S. Pat. No. 4,401,546, Nakamura et al., is to align the segments in straight lines to produce straight line gaps. As the result, not all of the gaps are perpendicular to the magnetic field which is directed radially from the central pole to the outer pole. A large portion of the gaps are angled close to parallel to the magnetic field, with the result that the space occupied by the gaps is wasted and could better be utilized to provide target material.

Still another approach is to cut slots in a piece of target material to form the gaps. The piece of target material is bonded on a back plate and is carefully cut down to the back plate. The cuts are in straight lines and produce straight line gaps entirely across the target. As the result, once again, not all of the gaps are perpendicular to the magnetic field which is directed radially from the central pole to the outer pole. Also, a large portion of the gaps are angled close to parallel to the magnetic field, with the result that the space occupied by the gaps is wasted and could better be utilized to provide target material. Additionally, a great deal of cutting is conducted beyond that necessary to form only the useful gaps.

SUMMARY OF THE INVENTION

It is an object of the present invention to provide a slot pattern in a target providing gaps which closely match the pattern of the magnetic field of the magnetron.

It is another object of the present invention to provide a pattern of gaps in the target of specified widths.

Still another object of the present invention is to provide slots in a single piece of target material and to provide structural support in the slotted structure to maintain the gaps in alignment.

A further object of the present invention is to provide a slot pattern which eliminates wasted and superfluous gaps.

Disclosed is a target for a ferromagnetic sputtering apparatus formed of a single piece of ferromagnetic target material. The target has a central area which may be circular, an outer area which may be annular, and a plurality of interconnected slots of specified width in the single piece extending in circumferential directions about the central area, forming a plurality of specified radial gaps between the central area and the outer area. The slots of the sputtering target may be arranged to provide tabs crossing the slots to provide structural support to the slots.

The slots may additionally be arranged in one or more continuous back and forth patterns in one or more sectors such that the tabs are disposed at sector boundaries.

The slot pattern may be separate circles, or may be one or more continuous spirals.

The slots may have different, specified widths at different radial positions so as to control the pattern of magnetic flux over the target.

A ferromagnetic sputtering apparatus employing the described target is also disclosed.

For a fuller understanding of the present invention, reference should be made to the following detailed description taken in conjunction with the accompanying drawings.

BRIEF DESCRIPTION OF THE DRAWINGS

FIGS. 11 through 15 are plan and sectional views of another alternative embodiment of a sputtering target of the present invention;

DETAILED DESCRIPTION OF THE INVENTION

Figure 1:
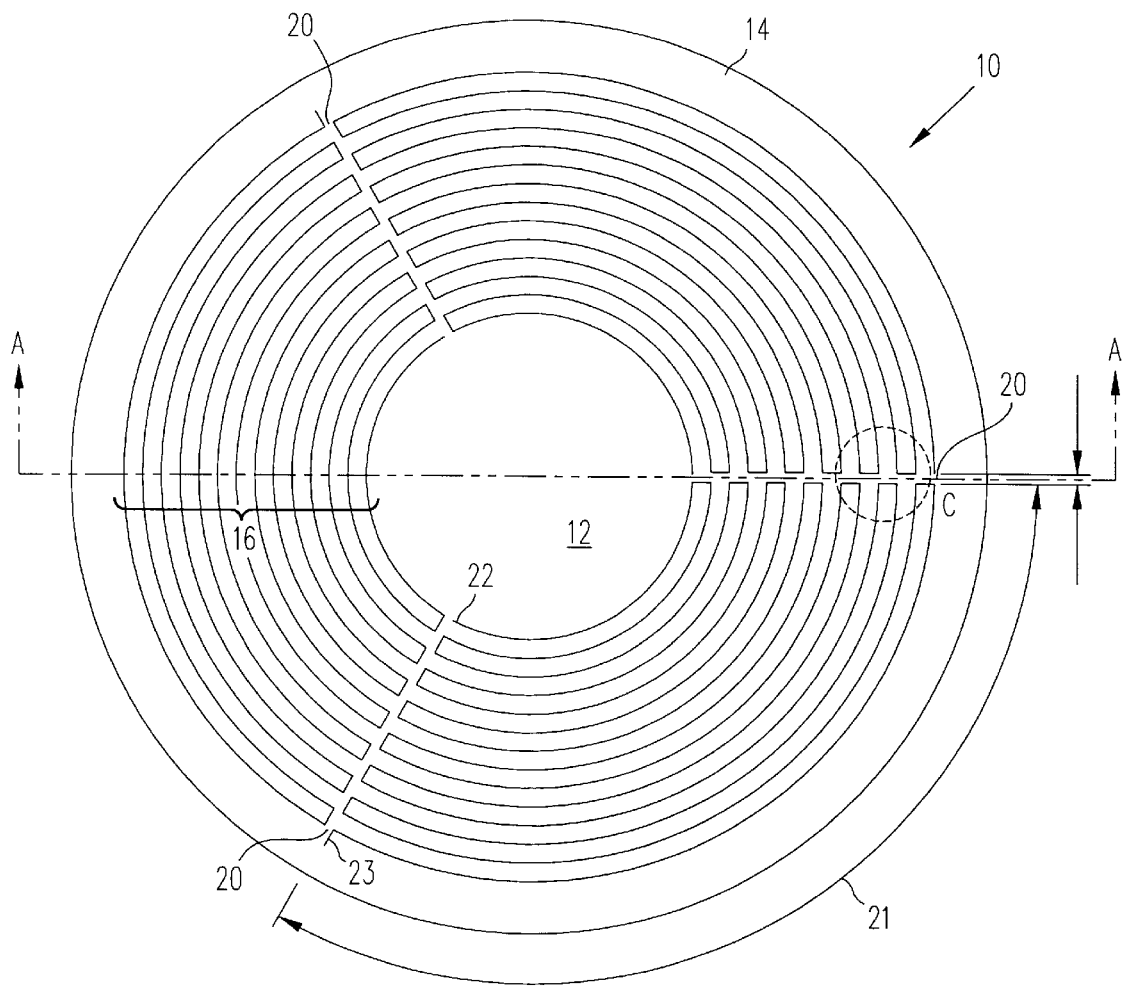
FIGS. 1 through 5 are plan and sectional views of one embodiment of a sputtering target of the present invention.
Figure 2:
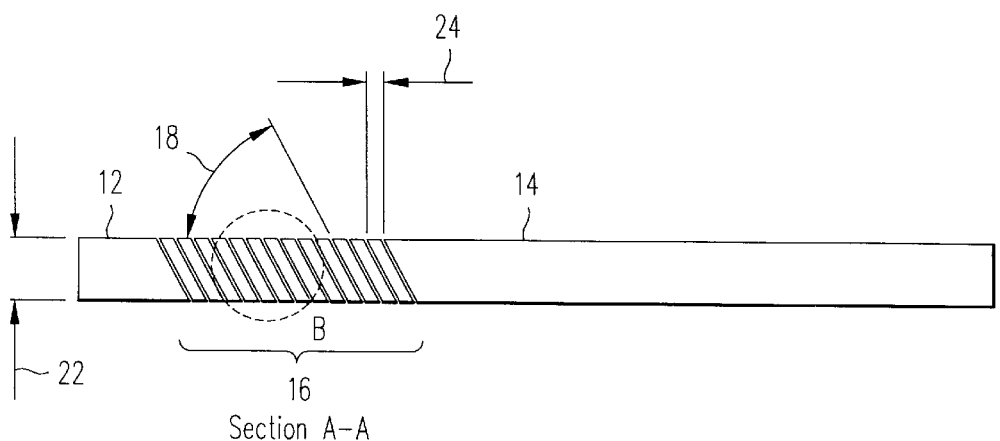
Figure 3:
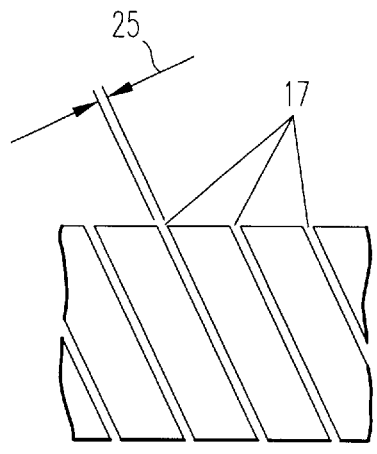
Figure 4:
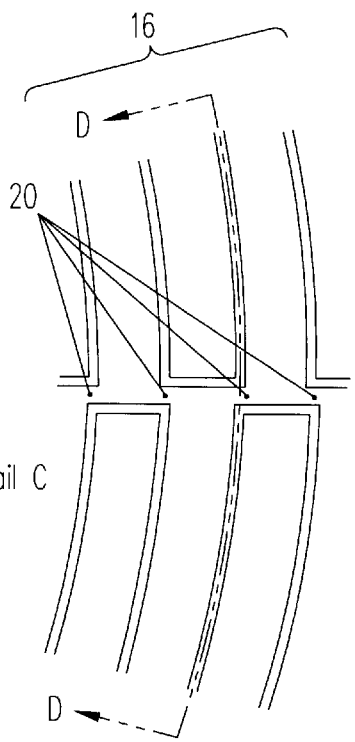
Figure 5:
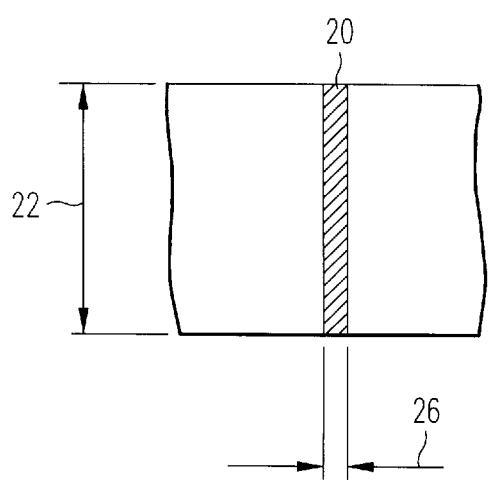

Referring to FIGS. 1 through 5, in accordance with one embodiment of the present invention, a single piece sputtering target 10 of iron, nickel, or other ferromagnetic material is provided, having a central area 12 and an outer area 14. The sputtering target 10 is formed of a generally homogeneous target material which is well known to those of skill in the art and is commercially available.

The central area 12 and the outer area 14 are separated by a set of slots 16 which are machined through the single piece sputtering target 10. The slots 16 may be machined by wire electro-discharge machining, or EDM, a precision machining technique which is known to those of skill in the art. A starting hole is drilled through the target 10, an EDM wire is fed through the hole and a voltage applied between the wire and target, while immersed in a dielectric, and the target is electro-eroded at the wire. The wire and target are moved with respect to one another in the desired pattern, machining slots of precise and specified width, forming gaps 17 in the target 10 of specified width. At a given circumference, the slot width should be uniform to prevent concentration of the magnetic field. However, for optimization, some slots may be varied in width as a function of radius from the center to optimize the erosion profile. Hence, hereinafter, such slots are characterized as of "specified" widths.

The slots 16 are preferably machined at an angle 18 to prevent line-of-sight exposure between the substrate that is to be deposited by the sputtered target and the base plate on which the target is mounted, as will be explained.

In the pattern of the embodiment of FIGS. 1 through 5, the slots 16 of the sputtering target 10 are arranged to provide tabs 20 crossing the slots to provide structural support to the specified width slots. To provide the tabs 20, the slots 16 are arranged in a continuous back and forth pattern in each of a plurality of sectors 21 such that the tabs 20 are disposed between and separate the sectors. In the embodiment of FIGS. 1 through 5, the sectors 21 each occupy approximately 120 degrees, thereby providing 3 sets of tabs 20. The continuous back and forth pattern allows an economical machining process by having each sector 21 of slots 16 machined in a single process. The machining may begin at either the inner end 22 or the outer end 23 of the pattern, and is conducted continuously to the other end of the pattern.

The structural support to the target 10 provided by the tabs 20 insures that the widths of the gaps 17 will remain unchanged after all the slots 16 are machined.

As is best seen in FIG. 1, the plurality of interconnected slots 16 of specified width of the present invention in the single piece target 10 extend in substantially circumferential directions about the central area 12, forming a plurality of specified radial gaps between the central area 12 and the outer area 14. The sputtering apparatus magnetron central pole is located at central area 12 and is of one polarity, and the outer pole, which is separated from and surrounds the central pole, is located at outer area 14, and is of the opposite polarity.

The magnetron provides a magnetic field in the target body 10 between the central area 12 and the outer area 14. The gaps formed by the slots 16 are therefore perpendicular to the flux of the magnetron, and the radial gaps formed by the slots 16 in the target body produce a more effective and homogeneous leakage magnetic field on and parallel to the surface of the target body so that the sputtering plasma density may be increased. The tabs 20 are small in area and cause minimal disturbance to the leakage magnetic field.

The resultant homogeneous leakage magnetic field causes the target to be sputtered uniformly and thereby last longer since no area of the target body 10 has a concentrated field which would wear faster than the remainder of the target.

An example of a target 10 in accordance with the embodiment of FIGS. 1 through 5, has a thickness 22 in range of 4–25 mm, a diameter in the range of 150–350 mm, slots 16 having a center-to-center spacing 24 in the range of 3–10 mm and at an angle 18 of 45–90 degrees, providing gaps 17 of width 25 in the range of 0.3 to 1.0 mm, and having tabs 20 of a thickness 26 in the range of 0.3 to 5 mm.

Figure 6:
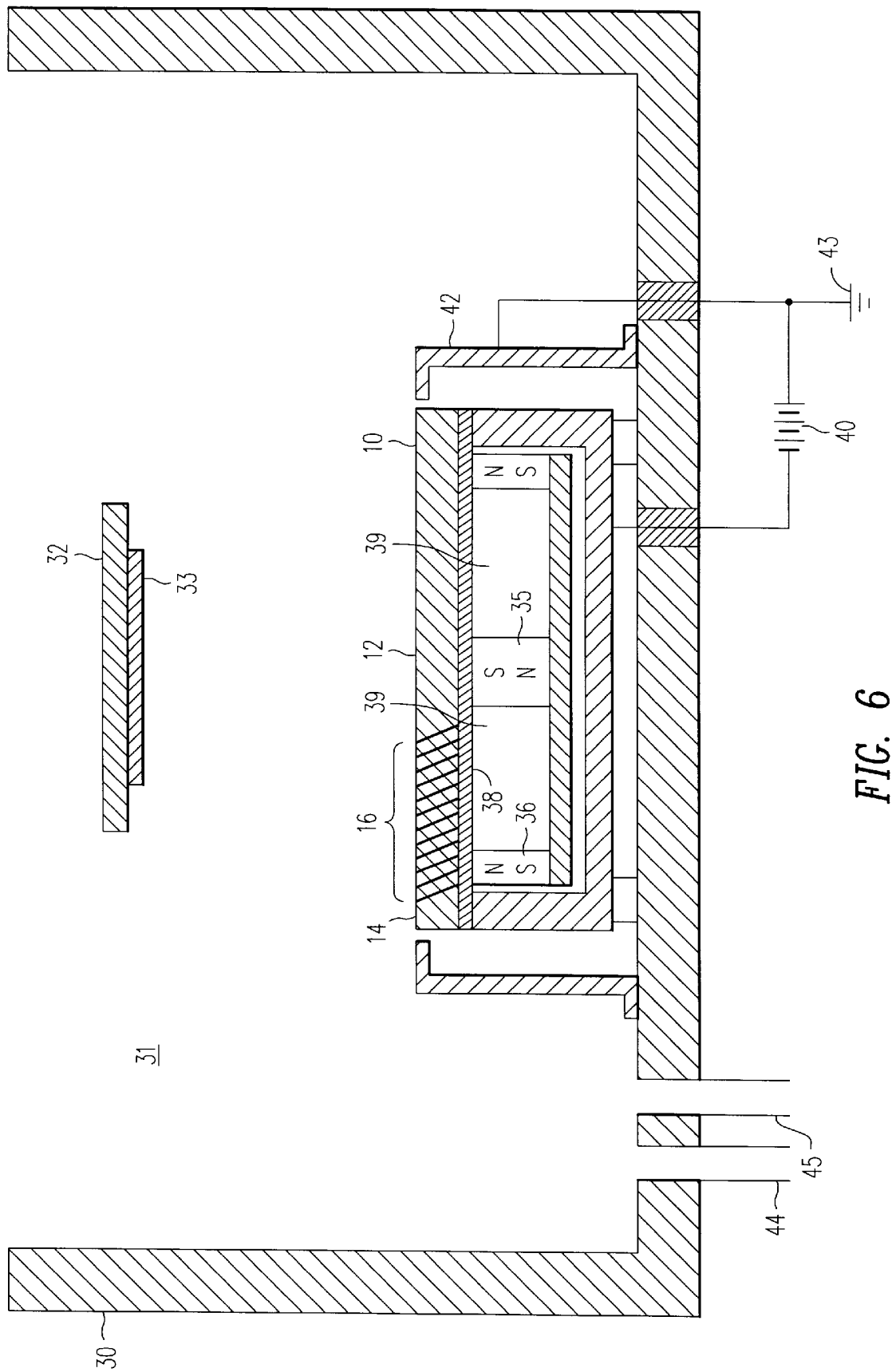
FIG. 6 is an illustration of a sputtering apparatus and a target of the present invention.

An embodiment of a ferromagnetic sputtering apparatus 30 in accordance with the present invention is illustrated in FIG. 6. The sputtering apparatus 30 includes a sputtering chamber 31. A substrate support 32 is provided which will support substrate 33 which is to receive the sputtered material. The sputtering apparatus 30 employs a magnetic field generator, or magnetron, having a central pole 35 of one polarity and an outer pole 36 of the opposite polarity where the outer pole is separated from and surrounds the central pole. A backing plate 38 supporting the target 10 is placed over the magnetic field generator.

The central area 12 of the target 10 is located at central pole 35 of the magnetron and outer area 14 of the target is located at outer pole 36 of the magnetron. Slots 16 extend between the central area 12 and the outer area 14 perpendicular to the flux of the magnetron between poles 35 and 36, and the radial gaps formed by the slots 16 in the target body 10 produce a more effective and homogeneous leakage magnetic field on and parallel to the surface of the target body.

A water cooling path 39 is provided in the area of the magnetic field generator between the poles 35 and 36 and under the backing plate 38. A cathode potential 40 is applied to the target 10 and an anode 42 surrounding the target is grounded 43 to sputter the target so that atomic flux from the target is deposited on the substrate. The chamber may be evacuated and filled at low pressure with an inert gas, such as argon, at lines 44 and 45.

Having slots 16 at an angle prevents line-of-sight exposure between the backing plate 38 and deposition substrate 33 and reduces the likelihood that impurities from the backing plate 38 will be deposited on the substrate 33.

An alternative embodiment of a sputtering target in accordance with the present invention is illustrated in FIGS. 7 through 10. A single piece sputtering target 50 of homogeneous iron, nickel, or other ferromagnetic target material is provided, as described above, having a central area 52 and an outer area 54.

Figure 7:
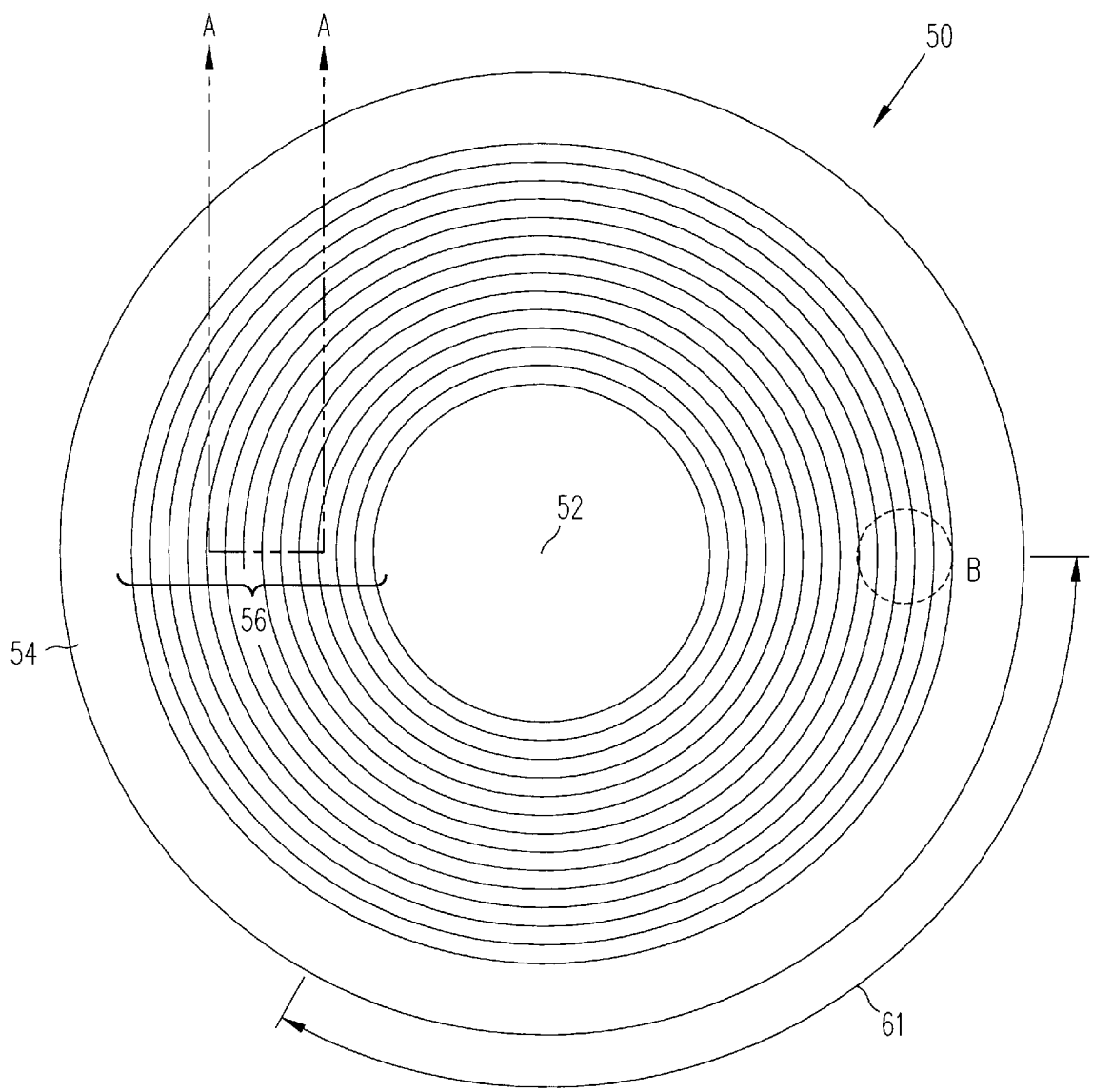
FIGS. 7 through 10 are plan and sectional views of an alternative embodiment of a sputtering target of the present invention.
Figure 8:
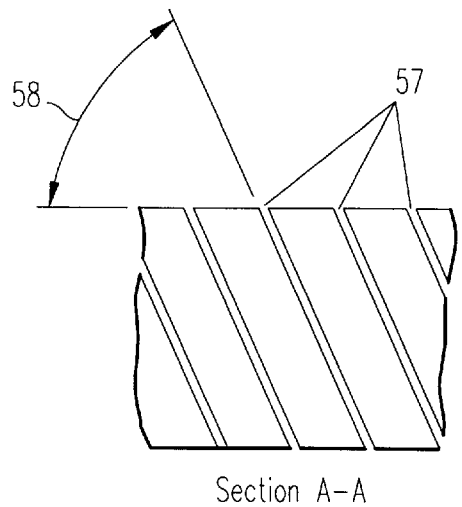
Figure 9:
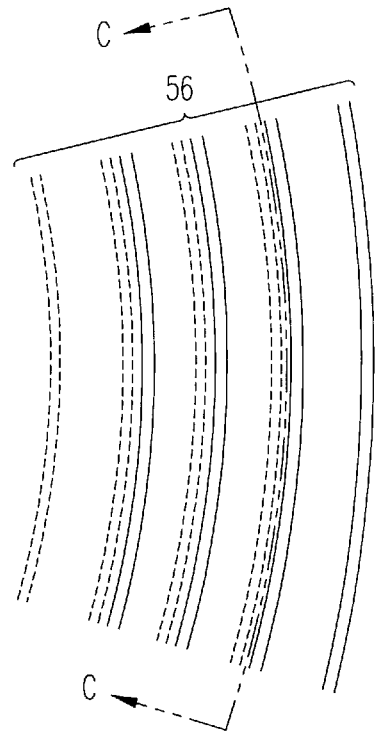
Figure 10:
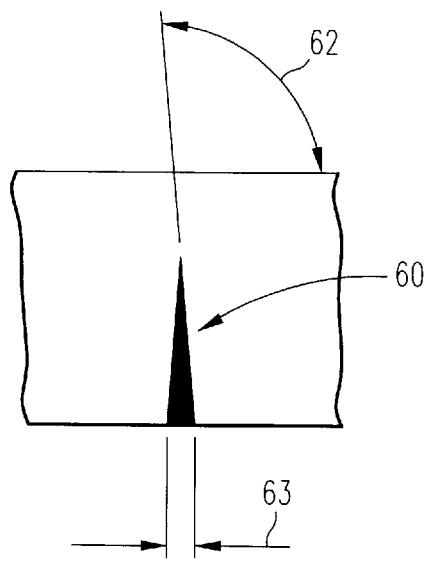
Figure 14:
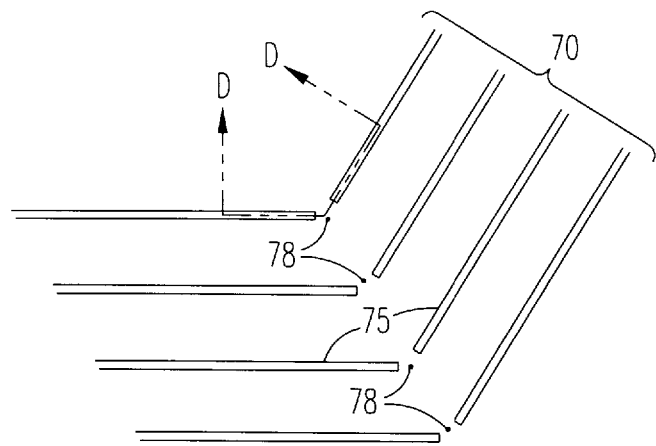
Figure 15:
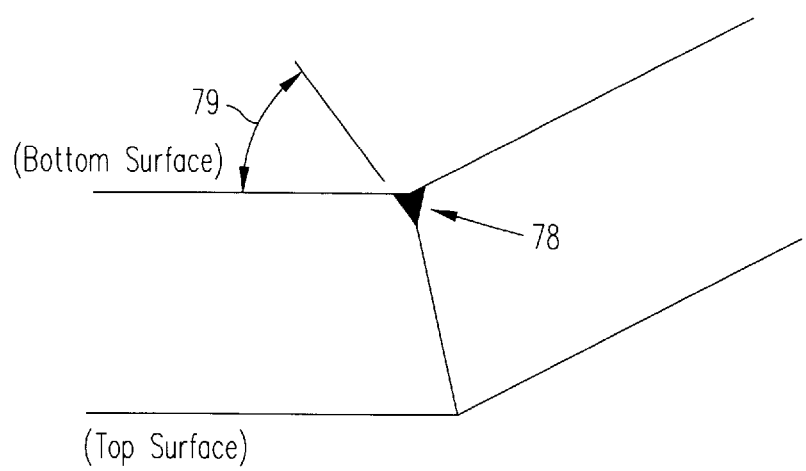

The central area 52 and the outer area 54 are separated by a set of slots 56 which are machined through the single piece sputtering target 50. The slots 56 may be machined by wire EDM, as described above. In the embodiment of FIGS. 7 through 10, the slots 56 are in the form of separate circles, each circle consisting of at least one, and preferably several, sectors separated by tabs. The tabs provide the structural support for the slots. FIG. 7 is a top view which appears to show only the slots and no tabs, which tabs are at the bottom surface of the target. A starting hole is drilled through the target 50 for each sector of each circle, and the EDM wire fed through the hole and the wire and target are moved with respect to one another in the desired pattern, machining slots of precise and specified width, forming gaps 57 in the target 50 of specified width. As above, the slots 56 are preferably machined at an angle 58 to prevent line-of-sight exposure between the substrate that is to be deposited by the sputtered target and the base plate on which the target is mounted.

In the pattern of the embodiment of FIGS. 7 through 10, the slots 56 of the sputtering target 50 are arranged to provide tabs 60 crossing the slots every 120 degrees of each circle, to provide structural support to the specified width slots. To provide the tabs 60, the machining of each slot 56 is discontinued at the location of the tab 60 and at an angle 62 greater than 90 degrees. The machining is then restarted on the opposite side of the tab at an angle also greater than or equal to 90 degrees, forming a triangular-shaped tab 60. The tabs are formed in 120 degree intervals, leaving 120 degree sectors of slots 56 between the tabs 60.

As an example, angle 62 may range from 90 to 135 degrees, tab 60 may range from 0.3 to 5 mm, and angle 58 may range from 45 to 90 degrees.

The structural support to the target 50 provided by the tabs 60 insures that the widths of the gaps 57 will remain unchanged after all the slots 56 are machined.

As is best seen in FIG. 7, the plurality of interconnected slots 56 of specified width of the present invention in the single piece target 50 extend in circumferential directions about the central area 52, forming a plurality of specified radial gaps between the central area 52 and the outer area 54.

As described above, the sputtering apparatus magnetron central pole is located at central area 52 and is of one polarity, and the outer pole, which is separated from and surrounds the central pole, is located at outer area 54, and is of the opposite polarity. The magnetron provides a magnetic field in the target body 50 between the central area 52 and the outer area 54. The gaps formed by the slots 56 are therefore perpendicular to the flux of the magnetron. The radial gaps 57 formed by the slots 56 in the target body produce a more effective and homogeneous leakage magnetic field on and parallel to the surface of the target body so that the sputtering plasma density may be increased. The tabs 60 are small in area and cause minimal disturbance to the leakage magnetic field.

The tabs 60 may be provided at smaller intervals, such as 60 degrees to provide even greater structural support for the gaps 57, but then require that the EDM wire be withdrawn and reinserted more often. Instead of an EDM wire, the machining may instead be by an EDM "sinker" which is a probe that does not necessarily machine entirely through the target 50. Thus, at the point of a tab 60, the EDM sinker may be partially withdrawn and then machining continued through the target 50 at the other side of the tab 60. EDM sinker technology is also known to those of skill in the art.

An example of a target 50 in accordance with the embodiment of FIGS. 7 through 10, is dimensionally the same as that of FIGS. 1 through 5, with the addition that the tabs 60 are machined at angles 62 in the range of 92 to 120 degrees and have a width 63 at the base in the range of 0.3 to 5 mm.

An alternative embodiment of the invention employing multifaceted straight line slots 70 is illustrated in FIGS. 11 through 15.

The slots 70 are formed in a single piece target 71, employing either wire EDM or sinker EDM, as described above. The slots 70 are machined in a pattern that forms gaps 75 which are as close to radial with respect to the central area 72 and the outer area 74 as possible. Again, the slots 70 are machined at an angle 76.

Tabs 78 are preferably formed at each junction of the straight line slots 70, which may be at 60 degree intervals. The tabs 78 are machined at a small angle 79 and formed at the bottom surface of the target 71, to provide a gap opening between the gaps 75. In an example of the embodiment illustrated in FIG. 15, the tabs 78 are formed with an angle 79 in the order of 53 degrees.

As a further alternative, which is not illustrated, the straight line slots 70 may be formed in the back and forth pattern of the target 10 in FIG. 1, thus allowing a single cut for each of the 6 60 degree sectors.

FIGS. 16 through 21 illustrate still further alternative embodiments of the sputtering targets of the present invention.

Figure 16:
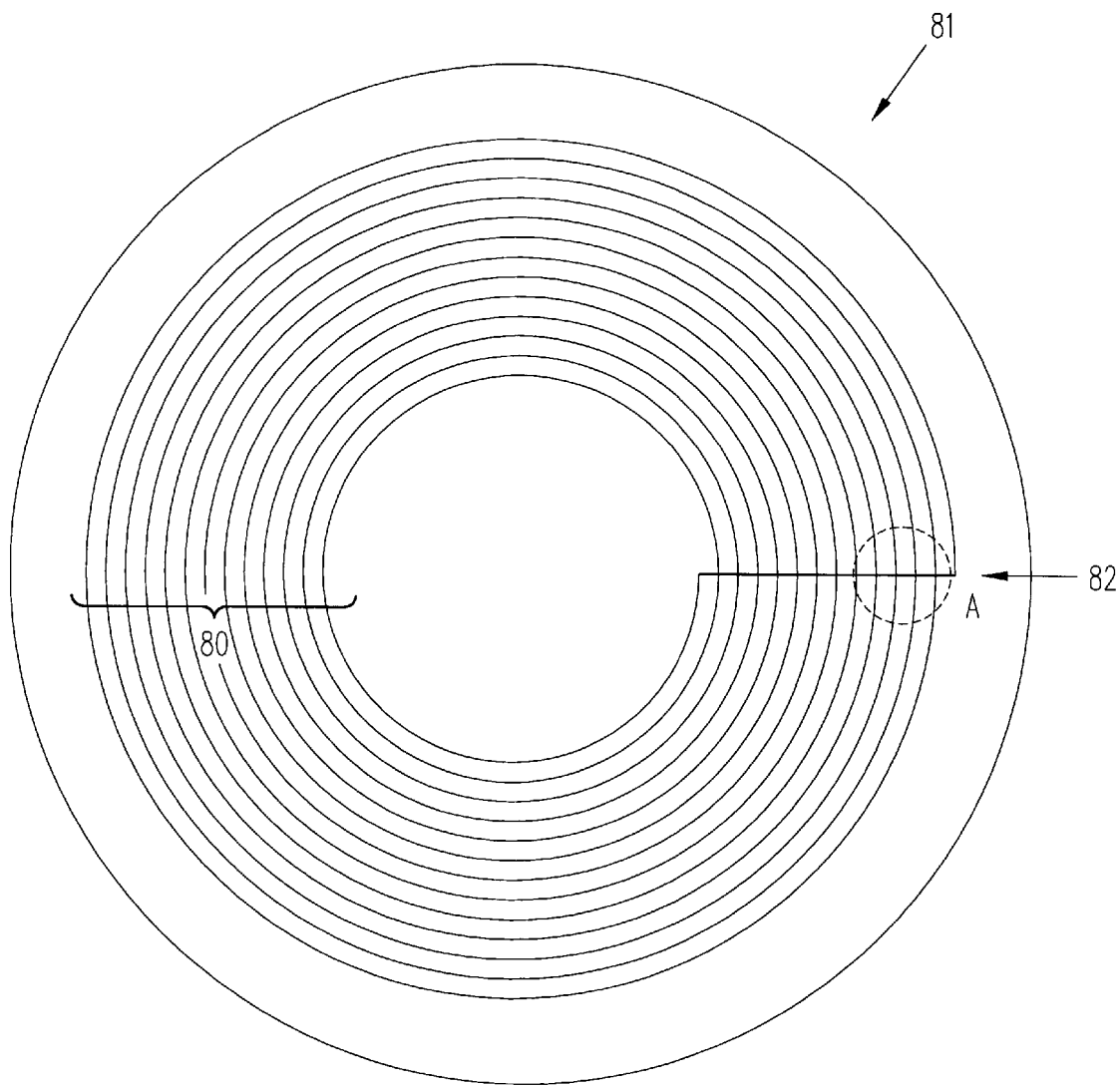
FIGS. 16 through 18 are plan views of three further alternative embodiments of sputtering targets of the present invention.

In FIG. 16, the slots 80 are machined through the entire thickness of a single piece target 81 in a continuous spiral pattern. Optionally, a slot 82 may be cut partially through the thickness of the target to reduce the shunting of magnetic flux around the spiral while also leaving tabs to retain the target in a single piece.

Figure 17:
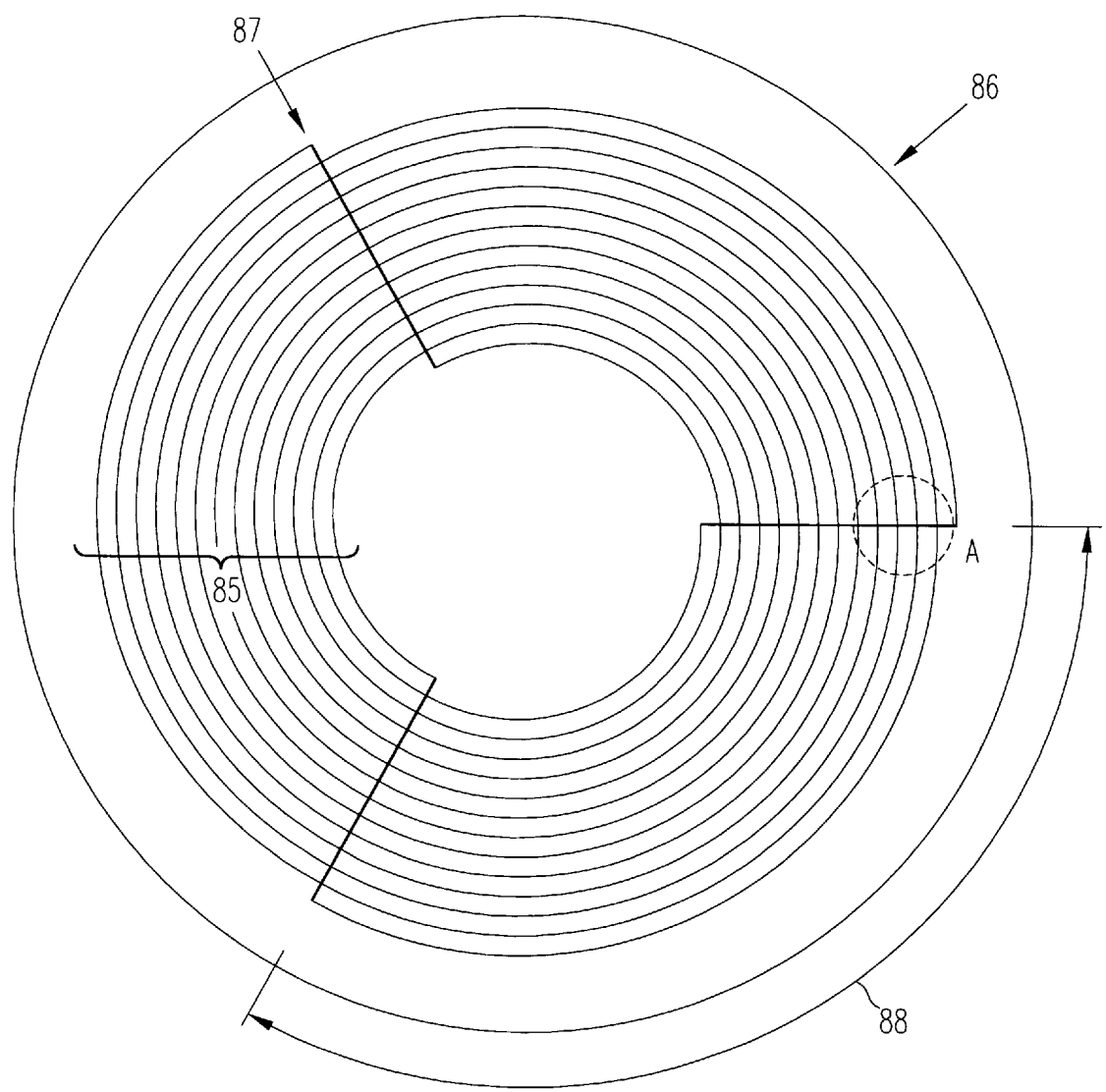

In the embodiment of FIG. 17, the slots 85 are machined through the thickness of a single piece target 86 in three interlaced spiral patterns. Again, each pattern may be full loop with slots 87 cut partially through the thickness of the target extending from the end of one spiral to the beginning of another of the spirals. The spirals, for example, may begin and end at intervals 88 of 120 degrees.

Figure 18:
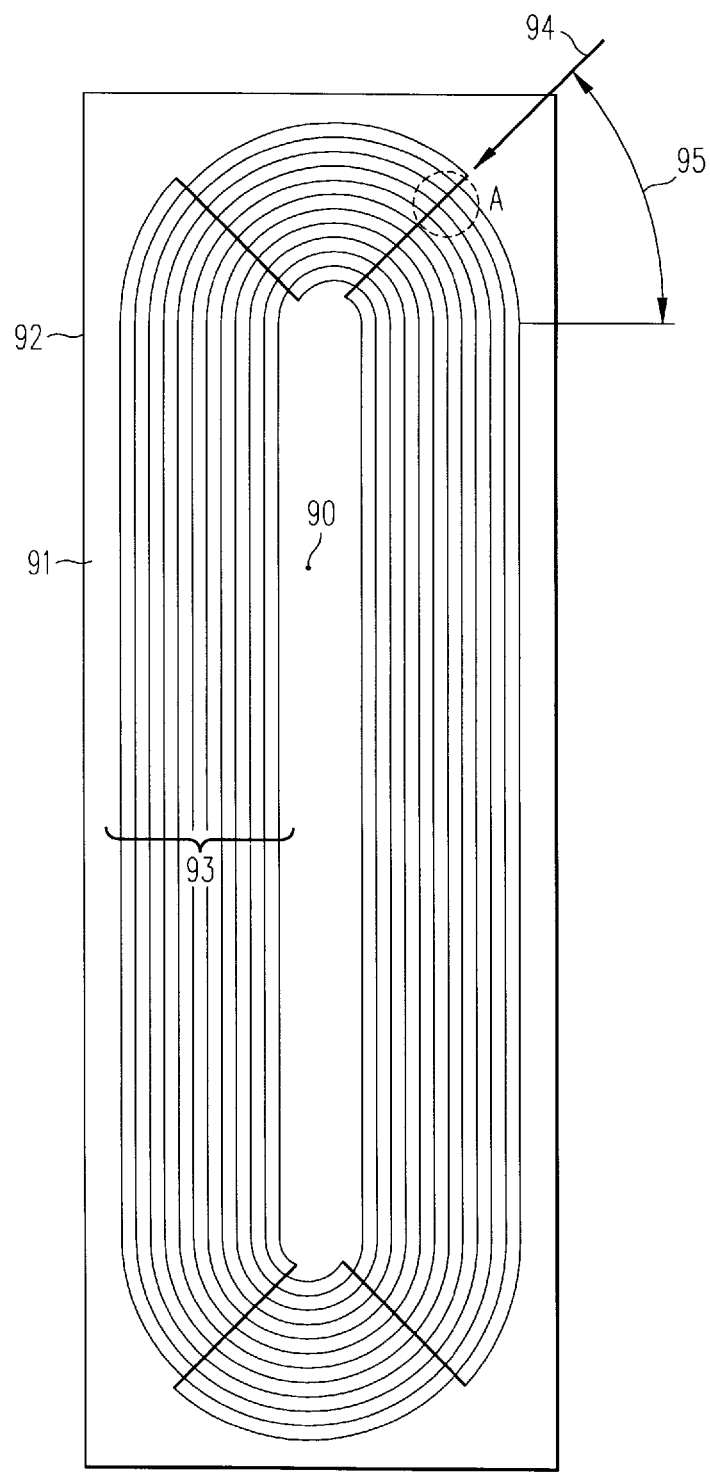

The embodiment of FIG. 18 is adapted for an elongated center pole piece of the magnetron and is a generally rectangular target shape. The central area 90 and the outer area 91 of the single piece target 92 are elongated, as are the slots 93. In the illustrated embodiment, four interlaced spirals are provided, which are interconnected by slots 94 cut partially through the thickness of the target which extend from the central area to the outer area, for example, from the end of one spiral to the beginning of another spiral. The interconnecting slots 94 are preferably located at an angle 95 of 0 to 50 degrees.

The elongated shape of FIG. 18 may also implement other of the patterns illustrated above, including the back and forth pattern of FIG. 1. As an example, the target may be from 100 to 300 mm in width, and 250 to 900 mm in length.

Figure 19:
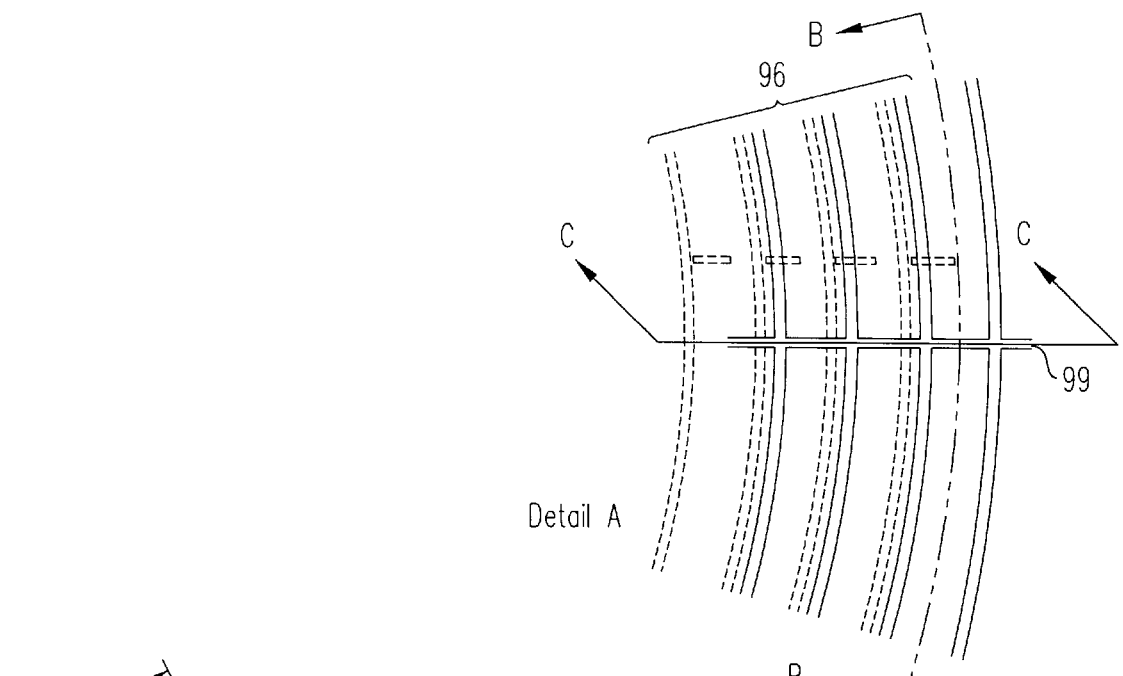
FIGS. 19 through 21 are plan and sectional views of details of the sputtering targets of FIGS. 16 through 18.
Figure 20:
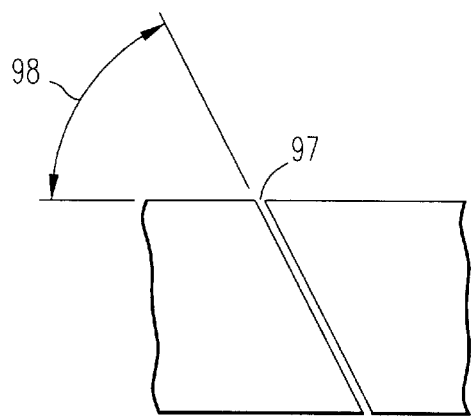
Figure 21:
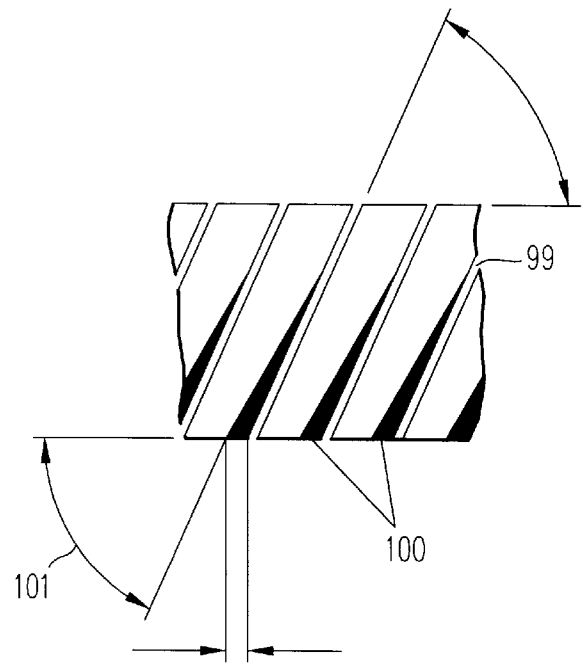

FIGS. 19 through 21 illustrate the details of the circumferential slots 80, 85 and 93 of FIGS. 16, 17 and 18, respectively, and their intersection with the partially cut interconnecting slots 82, 87, and 94 of FIGS. 16, 17 and 18, respectively, to form tabs. The slots 80, 85 and 93 are illustrated as slots 96 in FIGS. 19 through 21. Slots 96 form gaps 97 and are machined at an angle 98 with respect to the surface of the target. The slots 82, 87 and 94 are illustrated as slots 99 in FIGS. 19 and 21. The interconnecting slots 99 are cut to reduce shunting of magnetic flux around the spirals. The interconnecting slots 99 may be cut separately from the circumferential cuts 96 or may be cut when the circumferential cut reaches a sector boundary. The interconnecting slots 99 are machined by cutting only a portion of the slot in the radial direction to leave tabs 100. The cut is at two different angles 101 to reduce the size of the tab 100 by making it in a generally triangular shape. The cut may be made with a wire EDM which must be withdrawn and reinserted at the opposite side of the tab 100, or a sinker EDM may be raised at the angle 101 to form the triangular tab. The tabs 100 provide the structural support to the target and to the slots 96.

As an example, the angle 98 of the slots 96 which form gaps 97 may be in the range of 45 to 90 degrees, and the machined edge of the tabs 100 may be at an angle 101 in the range of 40 to 85 degrees, with the tabs having a thickness of 0.3 to 5 mm.

Further embodiments which are perturbations or combinations of the illustrated patterns may be easily envisioned and are considered to be within the scope of the present invention.

While the preferred embodiments of the present invention have been illustrated in detail, it should be apparent that modifications and adaptations to those embodiments may occur to one skilled in the art without departing from the scope of the present invention as set forth in the following claims.

I claim:

1. A target for a ferromagnetic sputtering apparatus comprising:

a single piece of ferromagnetic target material having a central area;

an outer area; and a plurality of slots in said single piece extending in a substantially circumferential direction about said central area, forming a plurality of specified width gaps substantially perpendicular to said circumferential direction between said central area and said outer area, wherein said slots are arranged to provide tabs crossing said slots to provide structural support to said gaps.

2. The sputtering target of claim 1, wherein: said central area is circular; said outer area is annular; and said slots are arranged to provide a circular pattern of said gaps.

3. The sputtering target of claim 1, wherein said slots are arranged in a continuous back and forth pattern in at least one sector such that said tabs are disposed at the boundaries of said sectors and separate said sectors.

4. The sputtering target of claim 1, wherein said slots are angled from the perpendicular with respect to the surface of said piece of target material.

5. The sputtering target of claim 1, wherein said slots are arranged in multifaceted straight lines.

6. The sputtering target of claim 1, wherein said slots comprise at least one continuous slot extending in said substantially circumferential direction arranged in a spiral fashion between said central area and said annular outer area.

7. The sputtering target of claim 2, wherein said slots comprise interlaced continuous spirals between said central area and said annular outer area.

8. The sputtering target of claim 6, wherein said at least one spiral circumferential slot is cut entirely through said target material, additionally comprising:

interconnecting slots in a direction substantially perpendicular to said circumferential direction partially cut through said target material forming tabs thereat to provide structural support.

9. The sputtering target of claim 1, wherein: said central area is generally rectangular; said outer area is generally rectangular; and said slots are arranged to provide a generally rectangular pattern of said gaps.

10. The sputtering target of claim 1, wherein said slots are of uniform width to form said specified width gaps at a uniform width.

11. A ferromagnetic sputtering apparatus comprising:

an evacuable chamber;

an anode for supporting a substrate in said chamber;

a magnetron having a center area pole and an outer peripheral pole opposite in polarity to said center area pole, providing a magnetic field therebetween; and a ferromagnetic target adjacent said magnetron formed of a single piece of target material having a central area adjacent said magnetron center area pole, an outer area adjacent said outer peripheral pole, and a plurality of slots in said single piece extending in a substantially circumferential direction about said central area, forming a plurality of specified width gaps substantially perpendicular to said circumferential direction between said central area and said outer area, which gaps are substantially perpendicular to said field of said magnetron, wherein said slots are arranged to provide tabs crossing said slots to provide structural support to said gaps.

12. The ferromagnetic sputtering apparatus of claim 11, wherein said ferromagnetic target central area is circular; said outer area is annular; and said slots are arranged to provide a circular pattern of said gaps.

13. The ferromagnetic sputtering apparatus of claim 11, wherein said slots are arranged in a continuous back and forth pattern in at least one sector such that said tabs are disposed at the boundaries of said sectors separate said sectors.

14. The ferromagnetic sputtering apparatus of claim 11, wherein said slots are angled from the perpendicular with respect to the surface of said piece of target material.

15. The ferromagnetic sputtering apparatus of claim 11, wherein said slots are arranged in multifaceted straight lines.

16. The ferromagnetic sputtering apparatus of claim 11, wherein said slots comprise at least one continuous slot extending in said substantially circumferential direction arranged in a spiral fashion between said central area and said annular outer area.

17. The ferromagnetic sputtering apparatus of claim 11, wherein said slots comprise interlaced continuous spirals between said central area and said annular outer area.

18. The ferromagnetic sputtering apparatus of claim 16, wherein said at least one spiral circumferential slot is cut entirely through said target material, additionally comprising:

interconnecting slots in a direction substantially perpendicular to said circumferential direction partially cut through said target material forming tabs thereat to provide structural support.

19. The ferromagnetic sputtering apparatus of claim 11, wherein said central area is generally rectangular; said outer area is generally rectangular; and said slots are arranged to provide a generally rectangular pattern of said gaps.

20. The ferromagnetic sputtering apparatus of claim 11, wherein said slots are of uniform width to form said specified width gaps at a uniform width.

\* \* \* \* \*